(12) United States Patent
Zhou et al.

(10) Patent No.: US 11,544,140 B2
(45) Date of Patent: Jan. 3, 2023

(54) METHOD AND APPARATUS FOR GENERATING ERROR REPORTING CONTENT OF DEEP LEARNING FRAMEWORK

(71) Applicant: Beijing Baidu Netcom Science and Technology Co., Ltd., Beijing (CN)

(72) Inventors: Wei Zhou, Beijing (CN); Xiang Lan, Beijing (CN); Weihang Chen, Beijing (CN); Tao Luo, Beijing (CN)

(73) Assignee: BEIJING BAIDU NETCOM SCIENCE AND TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 17/211,680

(22) Filed: Mar. 24, 2021

(65) Prior Publication Data
US 2022/0083417 A1 Mar. 17, 2022

(30) Foreign Application Priority Data
Sep. 15, 2020 (CN) .......................... 202010969161.7

(51) Int. Cl.
*G06F 11/08* (2006.01)
*G06N 3/08* (2006.01)
*H03M 7/30* (2006.01)

(52) U.S. Cl.
CPC ............. *G06F 11/08* (2013.01); *G06N 3/088* (2013.01); *H03M 7/30* (2013.01)

(58) Field of Classification Search
None
See application file for complete search history.

(56) References Cited

U.S. PATENT DOCUMENTS 5,724,503 A 3/1998 Kleinman et al.
10,649,882 B2 * 5/2020 Li .......................... G06F 11/079
(Continued)

FOREIGN PATENT DOCUMENTS

CN 105550059 A 5/2016
EP 0735471 A2 10/1996
(Continued)

OTHER PUBLICATIONS

Extended European Search Report, EP Application No. 21164387.9 dated Sep. 29, 2021, 9 pages.
(Continued)

*Primary Examiner* — Mujtaba M Chaudry
(74) *Attorney, Agent, or Firm* — Kwan & Olynick LLP

(57) ABSTRACT

The present application discloses a method and apparatus for generating error reporting content of a deep learning framework, an electronic device and a readable storage medium, which relates to the field of deep learning technologies. An implementation solution adopted by the present application to generate error reporting content of a deep learning framework is: acquiring an error code and error information corresponding to the error code; generating an error file according to the error code and the error information corresponding thereto, and packaging the error file into the deep learning framework; running the deep learning framework, and in response to the deep learning framework receiving an error code returned by a third-party library when an error occurs in calling of a third-party library application programming interface (API), extracting, from the error file, error information corresponding to the received error code; and generating error reporting content according to the error information. The present application can automatically generate error reporting content including richer information.

13 Claims, 2 Drawing Sheets

(56) References Cited

U.S. PATENT DOCUMENTS

| | | | |
|---|---|---|---|
| 2003/0037291 A1 | 2/2003 | Goldsmith et al. | |
| 2014/0006880 A1* | 1/2014 | Kimura | G06F 11/1008 |
| | | | 714/54 |
| 2015/0095748 A1* | 4/2015 | Abbasfar | G06F 11/0793 |
| | | | 714/819 |
| 2019/0026172 A1 | 1/2019 | Wu et al. | |
| 2019/0065343 A1* | 2/2019 | Li | G06F 11/0766 |
| 2021/0294707 A1* | 9/2021 | Evans | G06F 9/45558 |

FOREIGN PATENT DOCUMENTS

| | | |
|---|---|---|
| JP | 2006127496 A | 5/2006 |
| JP | 2007213116 A | 8/2007 |
| JP | 2016220010 A | 12/2016 |
| JP | 2018535492 A | 11/2018 |

OTHER PUBLICATIONS

Notice of Allowance for JP2021-131950 dated Aug. 2, 2022 (1 page).

* cited by examiner

METHOD AND APPARATUS FOR GENERATING ERROR REPORTING CONTENT OF DEEP LEARNING FRAMEWORK

The present application claims the priority of Chinese Patent Application No. 202010969161.7, filed on Sep. 15, 2020, with the title of "Method and apparatus for generating error reporting content of deep learning framework". The disclosure of the above application is incorporated herein by reference in its entirety.

FIELD OF THE DISCLOSURE

The present application relates to the field of computer technologies, and particularly to a method and apparatus for generating error reporting content of a deep learning framework, an electronic device and a readable storage medium in the field of deep learning technologies.

BACKGROUND OF THE DISCLOSURE

As a basic research tool in the field of artificial intelligence, a deep learning framework greatly facilitates developers in related fields. However, due to the complexity of the deep learning framework itself, when using the deep learning framework to train a deep learning model, a developer may call a large number of third-party library application programming interfaces (APIs) to implement corresponding functions.

A calling failure may occur when the deep learning framework calls the third-party library APIs. However, in the prior art, after the deep learning framework fails to call the API, only an error code returned by a third-party library may be displayed to the developer, resulting in that the developer cannot learn more detailed error information, thereby increasing the development cost of the developer and reducing the development efficiency of the developer.

SUMMARY OF THE DISCLOSURE

A technical solution adopted by the present application to solve the technical problem is to provide a method for generating error reporting content of a deep learning framework, including: acquiring an error code and error information corresponding to the error code; generating an error file according to the error code and the error information corresponding thereto, and packaging the error file into the deep learning framework; running the deep learning framework, and in response to the deep learning framework receiving an error code returned by a third-party library when an error occurs in calling of a third-party library API, extracting, from the error file, error information corresponding to the received error code; and generating error reporting content according to the error information.

A technical solution adopted by the present application to solve the technical problem is to provide an electronic device, comprising: at least one processor; and a memory communicatively connected with the at least one processor; wherein the memory stores instructions executable by the at least one processor, and the instructions are executed by the at least one processor to enable the at least one processor to perform a method for generating error reporting content of a deep learning framework, wherein the method comprises: acquiring an error code and error information corresponding to the error code; generating an error file according to the error code and the error information corresponding thereto, and packaging the error file into the deep learning framework; running the deep learning framework, and in response to the deep learning framework receiving an error code returned by a third-party library when an error occurs in calling of a third-party library API, extracting, from the error file, error information corresponding to the received error code; and generating error reporting content according to the error information.

There is provided a non-transitory computer readable storage medium with computer instructions stored thereon, wherein the computer instructions are used for causing a computer to perform a method for generating error reporting content of a deep learning framework, wherein the method comprises: acquiring an error code and error information corresponding to the error code; generating an error file according to the error code and the error information corresponding thereto, and packaging the error file into the deep learning framework; running the deep learning framework, and in response to the deep learning framework receiving an error code returned by a third-party library when an error occurs in calling of a third-party library application programming interface (API), extracting, from the error file, error information corresponding to the received error code; and generating error reporting content according to the error information.

One embodiment in the present application has the following advantages or beneficial effects: the present application can automatically generate error reporting content and make the generated error reporting content include richer information. Since a technical means of extracting, from an error file, error information corresponding to an error code is employed, the technical problem in the prior art that the deep learning framework only obtains an error code returned by a third-party library when failing to call a third-party library API is overcome, and a technical effect of automatically generating error reporting content including richer information is achieved.

Other effects of the above alternatives will be described below with reference to specific embodiments.

BRIEF DESCRIPTION OF DRAWINGS

The accompanying drawings are intended to better understand the solution and do not constitute limitations on the present application. In the drawings.

DETAILED DESCRIPTION OF PREFERRED EMBODIMENTS

Exemplary embodiments of the present application are described below with reference to the accompanying drawings, including various details of the embodiments of the present application to facilitate understanding, and should be considered as exemplary only. Therefore, those of ordinary skill in the art should be aware that various changes and modifications can be made to the embodiments described herein without departing from the scope and spirit of the present application.

Similarly, for clarity and simplicity, descriptions of well-known functions and structures are omitted in the following description.

Figure 1:
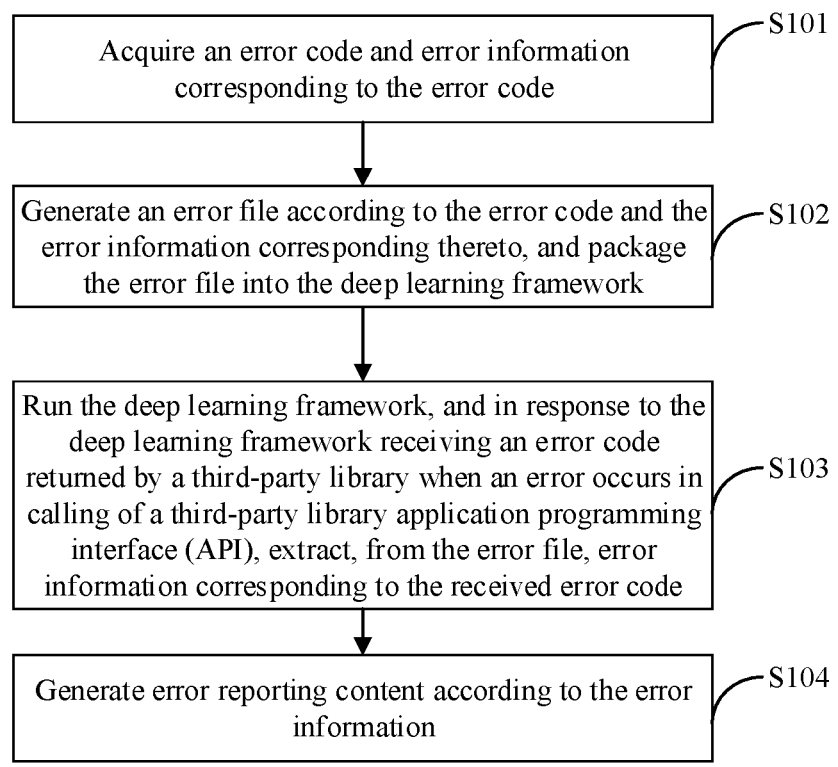
FIG. 1 is a schematic diagram of a first embodiment according to the present application.

FIG. 1 is a schematic diagram of a first embodiment according to the present application. As shown in FIG. 1, a method for generating error reporting content of a deep learning framework according to the present embodiment may specifically include following steps:

S101: An error code and error information corresponding to the error code are acquired.

S102: An error file is generated according to the error code and the error information corresponding thereto, and the error file is packaged into the deep learning framework.

S103: The deep learning framework is run, and in response to the deep learning framework receiving an error code returned by a third-party library when an error occurs in calling of a third-party library API, error information corresponding to the received error code is extracted from the error file.

S104: Error reporting content is generated according to the error information.

According to the method for generating error reporting content of a deep learning framework in the present embodiment, an error file is generated according to an error code and error information corresponding to the error code, so as to obtain a deep learning framework including the error file, so that error information corresponding to an error code returned by a third-party library is extracted from an error reporting file when the deep learning framework fails to call a third-party library API during its running, and error reporting content is then generated according to the error information, which can automatically generate error reporting content and make the generated error reporting content include richer information.

The error code acquired by performing step S101 in the present embodiment is used to identify an error type when the deep learning framework fails to call the third-party library API. When errors occur due to different reasons in the calling of the API, the errors correspond to different error codes. Since the third-party library may pre-configure different error codes for different error types, an error code may be acquired by accessing the third-party library in the present embodiment.

After S101 is performed to acquire the error code in the present embodiment, error information corresponding to the error code is acquired. The acquired error information is used to describe in detail the cause of the error, the solution, and other content. In the present embodiment, a webpage, a document, a website and other content corresponding to the error code may be automatically crawled, through crawler code, from the Internet as the error information corresponding thereto, or the error information corresponding thereto may be written manually by a developer.

It is understandable that the number of the error code acquired by performing S101 in the present embodiment may be one or more. If a plurality of error codes are acquired, error information corresponding to the error codes needs to be acquired respectively in the present embodiment.

After S101 is performed to acquire the error code and the error information corresponding thereto in the present embodiment, S102 is performed to generate an error file according to the error code and the error information corresponding thereto and to package the generated error file into the deep learning framework, so that the deep learning framework can parse the error information corresponding thereto.

Specifically, in the present embodiment, when S102 is performed to generate an error file according to the error code and the error information corresponding thereto, a following optional implementation may be employed: determining a programming language used by the deep learning framework, such as a Python language, a C++ language, or a Java language; and generating an error file corresponding to the determined programming language according to the error code and the error information corresponding thereto.

In the present embodiment, the error code and the error information corresponding thereto may also be serialized by using an existing protobuf protocol, and the serialized content is taken as the error file.

In other words, in the present embodiment, a language of the error file generated by performing S102 can correspond to a programming language used by the deep learning framework, which avoids the failure of error code parsing caused by the inconsistency between the error file and the language of the deep learning framework, and improves the success rate of generating the error reporting content.

Since the API in the third-party library is often updated, the error code corresponding to the API in the generated error files has certain timeliness. If an updated error code is not included in the error file, the deep learning framework cannot parse error information corresponding to the error code.

In order to ensure as much as possible that the error file includes the latest error code in the third party-library, in the present embodiment, after the error file is generated by performing S102, following content may be further included: recording the generation time of the error file; and updating the error code and the error information corresponding thereto in the error file in response to a time difference between the current time and the previous generation time reaching a preset time interval.

In addition, in order to avoid the occupation of more storage space in the deep learning framework due to a too large error reporting file, in the present embodiment, after S102 is performed to package the error file into the deep learning framework, a following optional implementation may be employed: compressing the error file; and packaging a compression result of the error file into the deep learning framework, that is, the deep learning framework includes the compressed error file.

In the present embodiment, steps S101 and S102 are completed before the running of the deep learning framework, so that when S103 is performed to run the deep learning framework in the present embodiment, in response to the deep learning framework receiving an error code returned by a third-party library when an error occurs in calling of a third-party library API, error information corresponding to the received error code can be extracted from the error file.

In the present embodiment, when S103 is performed to extract, from the error file, error information corresponding to the received error code, the extraction may be performed immediately after an error code returned by a third-party library is received.

In order to ensure the stability during the running of the deep learning framework, thee deep learning framework may have a mechanism for multiple retries when calling a third-party library API. That is, if the calling still fails after multiple retries, it is determined that the deep learning framework fails to call the third-party library API, and then error information corresponding to an error code returned by the third-party library due to the failure of the calling is acquired.

Therefore, in the present embodiment, when S103 is performed to, in response to the deep learning framework receiving an error code returned by a third-party library when an error occurs in calling of a third-party library API, extracting, from the error file, error information corresponding to the received error code, a following optional implementation may be employed: determining the number of retries corresponding to the third-party library API currently called by the deep learning framework; and in response to the deep learning framework receiving an error code returned by the third-party library when an error occurs in calling of the third-party library API after the number of retries, extracting, from the error file, error information corresponding to the received error code.

In other words, in the present embodiment, the deep learning framework may extract the error information corresponding thereto from the error file only if the calling still fails after multiple tries, which can improve the stability of the deep learning framework, avoid the waste of computing resources and improve the accuracy of error information acquisition.

In addition, in the present embodiment, if the error file is compressed when S102 is performed, when S103 is performed to extract, from the error file, error information corresponding to the received error code in the present embodiment, a following optional implementation may be employed: determining whether a decompression result of the error file is comprised in the deep learning framework; if yes, extracting, from the decompression result, the error information corresponding to the received error code; and otherwise, decompressing the error file, and then extracting, from a decompression result, the error information corresponding to the received error code.

For example, in the present embodiment, if the error file is obtained by serializing the error code and the error information corresponding thereto by using a protobuf protocol when S102 is performed, when S103 is performed in the present embodiment, the error file is deserialized by using the protobuf protocol at first, and then error information corresponding to the received error code is extracted from a deserialization result.

In the present embodiment, after S103 is performed to extract, from the error file, error information corresponding to the received error code, S104 is performed to generate error reporting content according to the extracted error information and to further display the error reporting content to a user, for example, the error reporting content is printed or directly displayed on a screen.

It is understandable that in the present embodiment, the extracted error information may be directly taken as error content when S104 is performed. In order to further enrich information included in the error content, in the present embodiment, when S104 is performed to generate error reporting content according to the error information, a following optional implementation may be employed: splicing preset particular information with the error information, and taking a splicing result as the error reporting content.

The preset particular information in the present embodiment may be call stack information, call number information and call time information for the deep learning framework to call the third-party library API this time.

With the above method according to the present embodiment, when the deep learning framework receives an error code returned by a third-party library when an error occurs in calling of a third-party library API, the error code can be automatically parsed according to an error file included in the deep learning framework, so as to acquire richer error reporting content including error information, which greatly reduces the development cost of a developer and improves the development efficiency of the developer.

Figure 2:
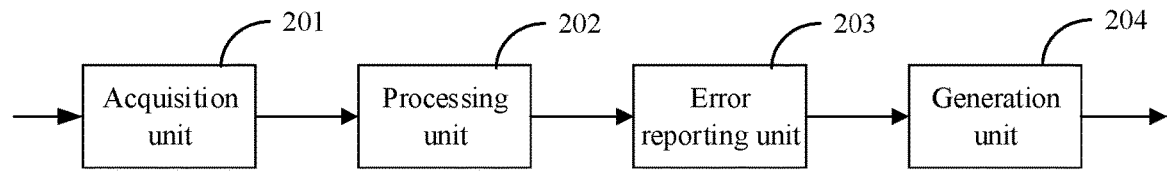
FIG. 2 is a schematic diagram of a second embodiment according to the present application.

FIG. 2 is a schematic diagram of a second embodiment according to the present application. As shown in FIG. 2, an apparatus for generating error reporting content of a deep learning framework in the present embodiment includes:

an acquisition unit 201 configured to acquire an error code and error information corresponding to the error code;

a processing unit 202 configured to generate an error file according to the error code and the error information corresponding thereto, and packaging the error file into the deep learning framework;

an error reporting unit 203 configured to run the deep learning framework, and in response to the deep learning framework receiving an error code returned by a third-party library when an error occurs in calling of a third-party library API, extract, from the error file, error information corresponding to the received error code; and a generation unit 204 configured to generate error reporting content according to the error information.

The error code acquired by the acquisition unit 201 is used to identify an error type when the deep learning framework fails to call the third-party library API. When errors occur due to different reasons in the calling of the API, the errors correspond to different error codes. Since the third-party library may pre-configure different error codes for different error types, the acquisition unit 201 may acquire an error code by accessing the third-party library.

After the acquisition unit 201 acquires the error code, error information corresponding to the error code is acquired. The acquired error information is used to describe in detail the cause of the error, the solution, and other content. The acquisition unit 201 may automatically crawl, through crawler code, a webpage, a document, a website and other content corresponding to the error code from the Internet as the error information corresponding thereto, or the acquisition unit 201 may acquire error information corresponding to the error code through manual writing by a developer.

It is understandable that the number of the error code acquired by the acquisition unit 201 may be one or more. If a plurality of error codes are acquired, the acquisition unit 201 needs to acquire error information corresponding to the error codes respectively.

After the acquisition unit 201 acquires the error code and the error information corresponding thereto in the present embodiment, the processing unit 202 generates an error file according to the error code and the error information corresponding thereto and packages the generated error file into the deep learning framework, so that the deep learning framework can parse the error information corresponding thereto.

Specifically, when the processing unit 202 generates an error file according to the error code and the error information corresponding thereto, a following optional implementation may be employed: determining a programming language used by the deep learning framework; and generating an error file corresponding to the determined programming language according to the error code and the error information corresponding thereto.

The processing unit 202 may also serialize the error code and the error information corresponding thereto by using an existing protobuf protocol, and the serialized content is taken as the error file.

In other words, a language of the error file generated by the processing unit 202 can correspond to a programming language used by the deep learning framework, which avoids the failure of error code parsing caused by the inconsistency between the error file and the language of the deep learning framework, and improves the success rate of generating the error reporting content.

Since the API in the third-party library is often updated, the error code corresponding to the API in the generated error files has certain timeliness. If an updated error code is not included in the error file, the deep learning framework cannot parse error information corresponding to the error code.

In order to ensure as much as possible that the error file includes the latest error code in the third party-library, after the error file is generated by the processing unit 202, following content may be further included: recording the generation time of the error file; and updating the error code and the error information corresponding thereto in the error file in response to a time difference between the current time and the previous generation time reaching a preset time interval.

In addition, in order to avoid the occupation of more storage space in the deep learning framework due to a too large error reporting file, after the processing unit 202 packages the error file into the deep learning framework, a following optional implementation may be employed: compressing the error file; and packaging a compression result of the error file into the deep learning framework, that is, the deep learning framework includes the compressed error file.

When the error reporting unit 203 extracts, from the error file, error information corresponding to the received error code, the extraction may be performed immediately after an error code returned by a third-party library is received.

In order to ensure the stability during the running of the deep learning framework, thee deep learning framework may have a mechanism for multiple retries when calling a third-party library API. That is, if the calling still fails after multiple retries, it is determined that the deep learning framework fails to call the third-party library API, and then error information corresponding to an error code returned by the third-party library due to the failure of the calling is acquired.

Therefore, when the processing unit 203, in response to the deep learning framework receiving an error code returned by a third-party library when an error occurs in calling of a third-party library API, extracts, from the error file, error information corresponding to the received error code, a following optional implementation may be employed: determining the number of retries corresponding to the third-party library API currently called by the deep learning framework; and in response to the deep learning framework receiving an error code returned by the third-party library when an error occurs in calling of the third-party library API after the number of retries, extracting, from the error file, error information corresponding to the received error code.

In other words, in the present embodiment, the deep learning framework may extract the error information corresponding thereto from the error file only if the calling still fails after multiple tries, which can improve the stability of the deep learning framework, avoid the waste of computing resources and improve the accuracy of error information acquisition.

In addition, if the processing unit 202 compresses the error file, when the error reporting unit 203 extracts, from the error file, error information corresponding to the received error code, a following optional implementation may be employed: determining whether a decompression result of the error file is comprised in the deep learning framework; if yes, extracting, from the decompression result, the error information corresponding to the received error code; and otherwise, decompressing the error file, and then extracting, from a decompression result, the error information corresponding to the received error code.

After the error reporting unit 203 extracts, from the error file, error information corresponding to the received error code, the generation unit 204 generates error reporting content according to the extracted error information and further displays the error reporting content to a user.

It is understandable that the generation unit 204 may directly take the extracted error information as error content. In order to further enrich information included in the error content, when the generation unit 204 generates error reporting content according to the error information, a following optional implementation may be employed: splicing preset particular information with the error information, and taking a splicing result as the error reporting content.

The preset particular information in the generation unit 204 may be call stack information, call number information and call time information for the deep learning framework to call the third-party library API this time.

According to embodiments of the present application, the present application further provides an electronic device and a readable storage medium.

Figure 3:
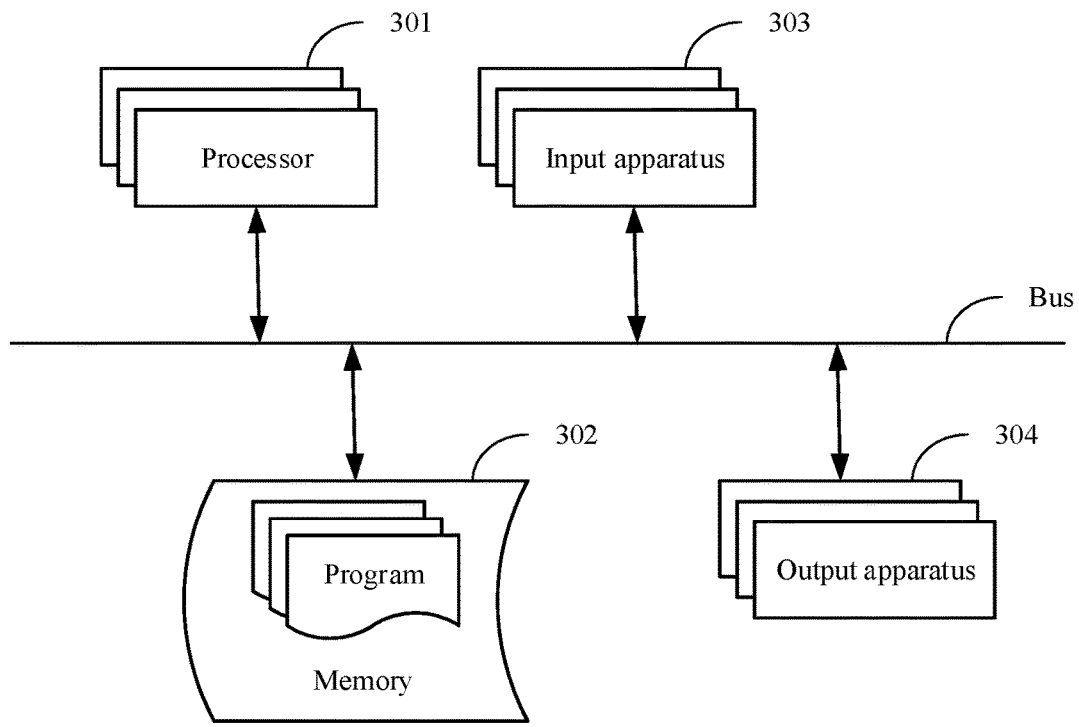
FIG. 3 is a block diagram of an electronic device configured to implement a method for generating error reporting content of a deep learning framework according to an embodiment of the present application.

As shown in FIG. 3, it is a block diagram of an electronic device for a method for generating error reporting content of a deep learning framework according to an embodiment of the present application. The electronic device is intended to represent various forms of digital computers, such as laptops, desktops, workbenches, personal digital assistants, servers, blade servers, mainframe computers and other suitable computers. The electronic device may further represent various forms of mobile devices, such as personal digital assistant, cellular phones, smart phones, wearable devices and other similar computing devices. The components, their connections and relationships, and their functions shown herein are examples only, and are not intended to limit the implementation of the present application as described and/or required herein.

As shown in FIG. 3, the electronic device includes: one or more processors 301, a memory 302, and interfaces for connecting various components, including high-speed interfaces and low-speed interfaces. The components are connected to each other by using different buses and may be installed on a common motherboard or otherwise as required. The processor may process instructions executed in the electronic device, including instructions stored in the memory or on the memory to display graphical information of a graphical user interface (GUI) on an external input/output apparatus (such as a display device coupled to the interfaces). In other implementations, a plurality of processors and/or buses may be used together with a plurality of memories, if necessary. Similarly, a plurality of electronic devices may be connected, each of which provides some necessary operations (for example, as a server array, a set of blade servers, or a multiprocessor system). One processor 301 is taken as an example is FIG. 3.

The memory 302 is the non-instantaneous computer-readable storage medium according to the present application. The memory stores instructions executable by at least one processor to make the at least one processor perform the method for generating error reporting content of a deep learning framework according to the present application. The non-instantaneous computer-readable storage medium according to the present application stores computer instructions. The computer instructions are used to make a computer perform the method for generating error reporting content of a deep learning framework according to the present application.

The memory 302, as a non-instantaneous computer-readable storage medium, may be configured to store non-instantaneous software programs, non-instantaneous computer executable programs and modules, for example, program instructions/modules corresponding to the method for generating error reporting content of a deep learning framework in the embodiment of the present application (e.g., the acquisition unit 201, the processing unit 202, the error reporting unit 203, and the generation unit 204 shown in FIG. 2). The processor 301 runs the non-instantaneous software programs, instructions and modules stored in the memory 302 to execute various functional applications and data processing of a server, that is, to implement the method for generating error reporting content of a deep learning framework in the above method embodiment.

The memory 302 may include a program storage area and a data storage area. The program storage area may store an operating system and an application required by at least one function; and the data storage area may store data created according to use of the electronic device. In addition, the memory 302 may include a high-speed random access memory, and may further include a non-instantaneous memory, for example, at least one disk storage device, a flash memory device, or other non-instantaneous solid-state storage devices. In some embodiments, the memory 302 optionally includes memories remotely disposed relative to the processor 301. The remote memories may be connected, over a network, to the electronic device for the method for generating error reporting content of a deep learning framework. Examples of the network include, but are not limited to, the Internet, intranets, local area networks, mobile communication networks and combinations thereof.

The electronic device for the method for generating error reporting content of a deep learning framework may further include: an input apparatus 303 and an output apparatus 304. The processor 301, the memory 302, the input apparatus 303 and the output apparatus 304 may be connected through a bus or in other manners. In FIG. 3, the connection through a bus is taken as an example.

The input apparatus 303 may receive input numerical information or character information, and generate key signal input related to user setting and function control of the electronic device for the method for generating error reporting content of a deep learning framework, for example, input apparatuses such as a touch screen, a keypad, a mouse, a trackpad, a touch pad, a pointer, one or more mouse buttons, a trackball, and a joystick. The output apparatus 304 may include a display device, an auxiliary lighting apparatus (e.g., an LED) and a tactile feedback apparatus (e.g., a vibration motor). The display device may include, but is not limited to, a liquid crystal display (LCD), a light-emitting diode (LED) display, and a plasma display. In some implementations, the display device may be a touch screen.

Various implementations of the systems and technologies described herein may be implemented in a digital electronic circuit system, an integrated circuit system, an application-specific integrated circuit (ASIC), computer hardware, firmware, software, and/or combinations thereof. The various implementations may include: being implemented in one or more computer programs. The one or more computer programs may be executed and/or interpreted on a programmable system including at least one programmable processor. The programmable processor may be a special-purpose or general-purpose programmable processor, receive data and instructions from a storage system, at least one input apparatus and at least one output apparatus, and transmit the data and the instructions to the storage system, the at least one input apparatus and the at least one output apparatus.

The computing programs (also referred to as programs, software, software applications, or code) include machine instructions for programmable processors, and may be implemented by using high-level procedural and/or object-oriented programming languages, and/or assembly/machine languages. As used herein, the terms "machine-readable medium" and "computer-readable medium" refer to any computer program product, device, and/or apparatus (e.g., a magnetic disk, an optical disc, a memory, and a programmable logic device (PLD)) configured to provide machine instructions and/or data to a programmable processor, including a machine-readable medium that receives machine instructions serving as machine-readable signals. The term "machine-readable signal" refers to any signal for providing the machine instructions and/or data to the programmable processor.

To provide interaction with a user, the systems and technologies described here can be implemented on a computer. The computer has: a display apparatus (e.g., a cathode-ray tube (CRT) or an LCD monitor) for displaying information to the user; and a keyboard and a pointing apparatus (e.g., a mouse or trackball) through which the user may provide input for the computer. Other kinds of apparatuses may also be configured to provide interaction with the user. For example, a feedback provided for the user may be any form of sensory feedback (e.g., visual, auditory, or tactile feedback); and input from the user may be received in any form (including sound input, voice input, or tactile input).

The systems and technologies described herein can be implemented in a computing system including background components (e.g., as a data server), or a computing system including middleware components (e.g., an application server), or a computing system including front-end components (e.g., a user computer with a graphical user interface or web browser through which the user can interact with the implementation mode of the systems and technologies described here), or a computing system including any combination of such background components, middleware components or front-end components. The components of the system can be connected to each other through any form or medium of digital data communication (e.g., a communication network). Examples of the communication network include: a local area network (LAN), a wide area network (WAN), and the Internet.

The computer system may include a client and a server. The client and the server are generally far away from each other and generally interact via the communication network. A relationship between the client and the server is generated through computer programs that run on a corresponding computer and have a client-server relationship with each other.

With the technical solutions according to the embodiments of the present embodiment, when the deep learning framework receives an error code returned by a third-party library when an error occurs in calling of a third-party library API, the error code can be automatically parsed according to an error file included in the deep learning framework, so as to acquire richer error reporting content including error information, which greatly reduces the development cost of a developer and improves the development efficiency of the developer.

It shall be understood that the steps can be reordered, added, or deleted using the various forms of processes shown above. For example, the steps described in the present application may be executed in parallel or sequentially or in different sequences, provided that desired results of the technical solutions disclosed in the present application are achieved, which is not limited herein.

The above specific implementations do not limit the extent of protection of the present application. Those skilled in the art should understand that various modifications, combinations, sub-combinations, and replacements can be made according to design requirements and other factors. Any modifications, equivalent substitutions and improvements made within the spirit and principle of the present application all should be included in the extent of protection of the present application.

What is claimed is:

1. A computer-implemented method for generating error reporting content of a deep learning framework, comprising:
   acquiring, by the deep learning framework, an error code returned by a third-party library when an error occurs when the deep learning framework is calling an application programming interface (API) of a third-party library and error information corresponding to the error code, wherein the error code is pre-configured by the third-party library and used for identifying a type of an error when the deep learning framework fails to call the API of the third-party library, and the error information is obtained by the deep learning framework and used for describing a cause of the error and a solution for the error;
   determining a programming language used by the deep learning framework, generating an error file which corresponds to the programming language, according to the error code and the error information corresponding thereto, and compressing the error file and packaging a compression result of the error file into the deep learning framework;
   running the deep learning framework, and in response to the deep learning framework receiving the same error code as the acquired error code, extracting, from the error file, the error information corresponding to the received error code; and
   generating error reporting content according to the error information.

2. The method according to claim 1, further comprising:
   recording a generation time of the error file after the generating an error file according to the error code and the error information corresponding thereto; and
   updating the error code and the error information corresponding thereto in the error file in response to a time difference between a current time and the previous generation time reaching a preset time interval.

3. The method according to claim 1, wherein the in response to the deep learning framework receiving an error code returned by a third-party library when an error occurs in calling of an API of a third-party library, extracting, from the error file, error information corresponding to the received error code comprises:
   determining a number of retries corresponding to the API of the third-party library currently called by the deep learning framework; and
   in response to the deep learning framework receiving an error code returned by the third-party library when an error occurs in calling of the API of the third-party library after the number of retries, extracting, from the error file, error information corresponding to the received error code.

4. The method according to claim 1, wherein the extracting, from the error file, error information corresponding to the received error code comprises:
   determining whether a decompression result of the error file is comprised in the deep learning framework;
   if yes, extracting, from the decompression result, the error information corresponding to the received error code; and
   otherwise, decompressing the error file, and then extracting, from a decompression result, the error information corresponding to the received error code.

5. The method according to claim 1, wherein the extracting, from the error file, error information corresponding to the received error code comprises:
   determining whether a decompression result of the error file is comprised in the deep learning framework;
   if yes, extracting, from the decompression result, the error information corresponding to the received error code; and
   otherwise, decompressing the error file, and then extracting, from a decompression result, the error information corresponding to the received error code.

6. The method according to claim 1, wherein the generating error reporting content according to the error information comprises:
   splicing preset particular information with the error information, and taking a splicing result as the error reporting content.

7. An electronic device, comprising:
   at least one processor; and
   a memory communicatively connected with the at least one processor;
   wherein the memory stores instructions executable by the at least one processor, and the instructions are executed by the at least one processor to enable the at least one processor to perform a method for generating error reporting content of a deep learning framework, wherein the method comprises:
   acquiring, by the deep learning framework, an error code returned by a third-party library when an error occurs when the deep learning framework is calling an application programming interface (API) of a third-party library and error information corresponding to the error code, wherein the error code is pre-configured by the third-party library and used for identifying a type of an error when the deep learning framework fails to call the API of the third-party library, and the error information is obtained by the deep learning framework and used for describing a cause of the error and a solution for the error;
   determining a programming language used by the deep learning framework, generating an error file which corresponds to the programming language, according to the error code and the error information corresponding thereto, and compressing the error file and packaging a compression result of the error file into the deep learning framework;
   running the deep learning framework, and in response to the deep learning framework receiving the same error code as the acquired error code, extracting, from the error file, the error information corresponding to the received error code; and
   generating error reporting content according to the error information.

8. The electronic device according to claim 7, further comprising:
recording a generation time of the error file after the generating an error file according to the error code and the error information corresponding thereto; and
updating the error code and the error information corresponding thereto in the error file in response to a time difference between a current time and the previous generation time reaching a preset time interval.

9. The electronic device according to claim 7, wherein the in response to the deep learning framework receiving an error code returned by a third-party library when an error occurs in calling of an API of a third-party library, extracting, from the error file, error information corresponding to the received error code comprises:
determining a number of retries corresponding to the API of the third-party library currently called by the deep learning framework; and
in response to the deep learning framework receiving an error code returned by the third-party library when an error occurs in calling of the API of the third-party library after the number of retries, extracting, from the error file, error information corresponding to the received error code.

10. The electronic device according to claim 7, wherein the extracting, from the error file, error information corresponding to the received error code comprises:
determining whether a decompression result of the error file is comprised in the deep learning framework;
if yes, extracting, from the decompression result, the error information corresponding to the received error code; and
otherwise, decompressing the error file, and then extract, from a decompression result, the error information corresponding to the received error code.

11. The electronic device according to claim 7, wherein the extracting, from the error file, error information corresponding to the received error code comprises:
determining whether a decompression result of the error file is comprised in the deep learning framework;
if yes, extracting, from the decompression result, the error information corresponding to the received error code; and
otherwise, decompressing the error file, and then extract, from a decompression result, the error information corresponding to the received error code.

12. The electronic device according to claim 7, wherein the generating error reporting content according to the error information comprises:
splicing preset particular information with the error information, and taking a splicing result as the error reporting content.

13. A non-transitory computer readable storage medium with computer instructions stored thereon, wherein the computer instructions are used for causing a computer to perform a method for generating error reporting content of a deep learning framework, wherein the method comprises:
acquiring, by the deep learning framework, an error code returned by a third-party library when an error occurs when the deep learning framework is calling an application programming interface (API) of a third-party library and error information corresponding to the error code, wherein the error code is pre-configured by the third-party library and used for identifying a type of an error when the deep learning framework fails to call the API of the third-party library, and the error information is obtained by the deep learning framework and used for describing a cause of the error and a solution for the error;
determining a programming language used by the deep learning framework, generating an error file which corresponds to the programming language, according to the error code and the error information corresponding thereto, and compressing the error file and packaging a compression result of the error file into the deep learning framework;
running the deep learning framework, and in response to the deep learning framework receiving the same error code as the acquired error code, extracting, from the error file, the error information corresponding to the received error code; and
generating error reporting content according to the error information.

* * * * *